(12) United States Patent
Wu et al.

(10) Patent No.: US 8,068,349 B2
(45) Date of Patent: Nov. 29, 2011

(54) POWER SUPPLY ARCHITECTURE FOR STRUCTURAL ASIC

(75) Inventors: Chang-Yu Wu, Tainan County (TW);
Ming-Hsin Ku, Hsinchu (TW);
Shang-Chih Hsieh, Kaohsiung County (TW); Hsin-Shih Wang, Fremont, CA (US)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 833 days.

(21) Appl. No.: 12/099,530

(22) Filed: Apr. 8, 2008

(65) Prior Publication Data

US 2009/0251872 A1    Oct. 8, 2009

(51) Int. Cl.
*H05K 1/11* (2006.01)
*H05K 1/14* (2006.01)

(52) U.S. Cl. .......................................... 361/793

(58) Field of Classification Search ............ 361/793, 361/794
See application file for complete search history.

(56) References Cited

U.S. PATENT DOCUMENTS 7,120,031 B2 *  10/2006  Chakravorty et al. ........ 361/762

* cited by examiner

*Primary Examiner* — Javaid Nasri
(74) *Attorney, Agent, or Firm* — Winston Hsu; Scott Margo

(57) ABSTRACT

A power supply architecture for a structural application-specific integrated circuit (ASIC) is provided. The power supply architecture includes a first conductor and a second conductor. The first conductor is coupled to a fixed voltage. The first conductor at least passes through two edges of a cell. The first conductor and the second conductor are connected through a contact. The second conductor at most passes through one edge of the cell. The structural ASIC includes a first metal layer and a second metal layer. The first metal layer includes the first conductor. The second metal layer includes the second conductor.

12 Claims, 3 Drawing Sheets

POWER SUPPLY ARCHITECTURE FOR STRUCTURAL ASIC

BACKGROUND OF THE INVENTION

1. Field of the Invention

The present invention generally relates to a structural application-specific integrated circuit (ASIC), in particular, to a power supply architecture applied to a structural ASIC.

2. Description of Related Art

A common ASIC does not have a fixed structure, and a mask of each layer can be randomly designed, but the structural ASIC is different. FIG. 1 shows a partial structure of a conventional structural ASIC 100. A metal oxide semiconductor field effect (MOS) transistor exists at lower part of FIG. 1, which includes a P-type substrate 105, N-wells 103 and 104, and an insulating layer 102 of a gate. At the upper part, three metal layers 121-123 are connected to the MOS transistor through a contact 111.

The structural ASIC features in that some layers are fixed and cannot be changed, and other layers can be designed or altered by the user. For example, in the structural ASIC 100, all the layers under the metal layer 123 is fixed, and the layers above the metal layer 123 and all the layers of the metal layer 123 can be freely designed. In the structural ASIC, the layers which can be freely designed are referred to as programmable layers, and the layers which cannot be altered are referred to as non-programmable layers.

The user can design the product by using the non-programmable part as the basis, so as to save a part of the cost. Particularly, the mask of the bottommost layer is usually the most complicated and expensive. Under a desired status, a complete circuit can be obtained through adding several masks by the user. The structural ASIC 100 of FIG. 1 is set as an example, the bottommost layer can be the MOS transistor, and then the metal layers 121 and 122 are connected to the MOS transistor, so as to form the cells which are non-programmable. Then, the user may connect the cells with the programmable metal layers above 123, so as to form the required functions. Recently, a metal programmable cell array (MPCA) available on the market is similarly a structural ASIC.

All the circuits require a power supply line and a ground line, and in a conventional structural ASIC, no matter the programmable or the non-programmable metal layer adopts the design as shown in FIG. 2. FIG. 2 shows atypical cell 201 and a power supply line 202 and a ground line 203 therein. The power supply line 202 and the ground line 203 are shared by a plurality of cells, so the power supply line 202 and the ground line 203 pass through many cells by adopting a passing-through design. The problem is that the passing-through power supply line and ground line occupy much precious area, particularly on the programmable layers. In order to save the mask cost, the user naturally hopes that the programmable layers are the less the better. In order to achieve the objective, it is necessary to simplify the routing of the programmable layers, and it is a method to reduce the total area of the wire. Under this requirement, the passing-through power supply line and ground line are obstacles of the routing simplification.

SUMMARY OF THE INVENTION

Accordingly, the present invention is directed to a power supply architecture for a structural ASIC, capable of reducing area occupied by a power supply line and a ground line, so as to simplify routing of cell.

The present invention provides a power supply architecture, applied to a structural ASIC. The power supply architecture includes a first conductor and a second conductor. The first conductor is coupled to a fixed voltage, and at least passes through two edges of a cell. The second conductor and the first conductor are connected through a contact. The second conductor at most passes through an edge of the cell. The structural ASIC includes a first metal layer and a second metal layer, the first metal layer includes the first conductor and the second metal layer includes the second conductor.

In an embodiment of the present invention, the fixed voltage can be a power supply voltage, a reference voltage, or a ground voltage.

In an embodiment of the present invention, the second conductor only passes through an edge of the cell, and does not pass through other edges of the cell.

In an embodiment of the present invention, the second conductor is in the cell, and does not pass through any edge of the cell.

In an embodiment of the present invention, the first metal layer is a non-programmable metal layer, and the second metal layer can be a programmable metal layer or a non-programmable metal layer.

In the present invention, the power supply line and the ground line of only one metal layer is in the passing-through design, and the power supply lines and the ground lines of other metal layers are changed to the non-passing-through design, so as to reduce the area occupied by the power supply lines and the ground lines, thereby simplifying the routing of the cell.

In order to the make aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
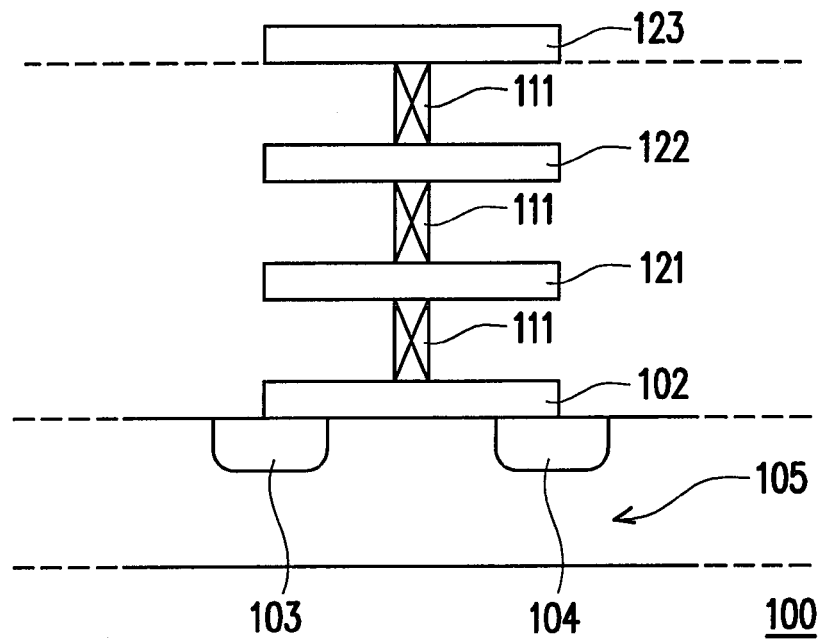
FIG. 1 is a schematic structural view of a conventional structural ASIC.

Reference will now be made in detail to the present embodiments of the invention, examples of which are illustrated in the accompanying drawings. Wherever possible, the same reference numbers are used in the drawings and the description to refer to the same or like parts.

Figure 2:
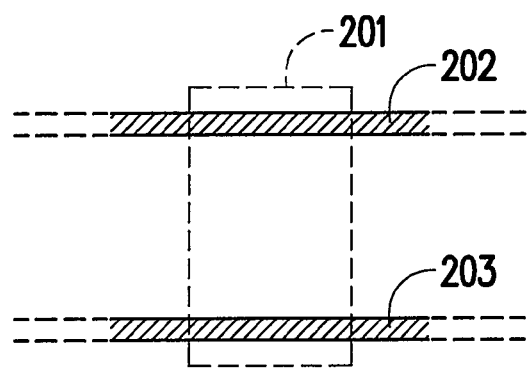
FIG. 2 is a schematic view of a power supply line and a ground line of a conventional cell.

For the power supply line and the ground line, the conventional design is as shown in FIG. 2, each metal layer has the power supply line and the ground line passing through each cell, such that all the circuits can receive the electric power. In practice, from the perspective of the whole structural ASIC, so many power supply lines and ground lines are not required. For example, it is possible to fabricate the MOS transistors on bottom non-programmable layers, as long as the power supply lines and the ground lines passing through all the cells are disposed on one of the non-programmable layers, all the circuit can receive the electric power. For the upper programmable layers, it is only necessary to use a small segment or even a point of the power supply line and the ground line, for matching with the circuit design requirement to connect a source or a drain of a certain MOS transistor to the power supply or the ground, or to connect the gate of the MOS transistor which is not used to the power supply or the ground, thereby preventing floating. That is, as long as the power supply line and the ground line passing through all the cells are disposed on one metal layer, other layers only need the segment of the power supply line and the ground line, thereby saving much area and simplifying the routing.

Figure 3:
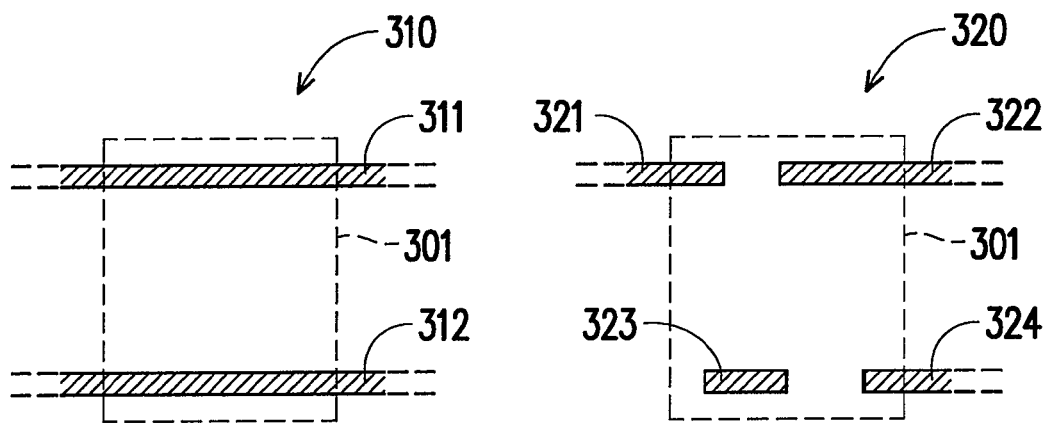
FIG. 3 is a schematic view of the power supply line and the ground line of the power supply architecture applied to a structural ASIC according to an embodiment of the present invention.

FIG. 3 is a schematic view of the power supply line and the ground line of the power supply architecture according to an embodiment of the present invention. The power supply architecture is applied to the structural ASIC. A cell of this embodiment is marked by 301, and two different metal layers are marked by 310 and 320. The metal layer 310 includes a power supply line 311 and a ground line 312. The metal layer 320 includes power supply lines 321 and 322, and ground lines 323 and 324. The power supply lines 311, 321 and 322 are connected through a contact. The ground lines 312, 323, and 324 are also connected through the contact.

The cell of this embodiment has four edges, namely, upper, lower, left, and right edges. The metal layer 310 adopts a passing-through design. That is, each power supply line and each ground line at least pass through two edges of the cell 301. The metal layer 320 adopts a non-passing-through design, or a segment design. That is, each power supply line and each ground line at most pass through an edge of the cell 301. For example, any one of the power supply lines 321 and 322 and the ground line 324 only passes through an edge of the cell 301, and does not pass through other edges. The ground line 323 is in the cell 301, and does not pass through any edge. In the metal layer 320, the area of the power supply lines 321 and 322 and the ground lines 323 and 324 can be reduced as small as possible, so long as the area is larger than or equal to the minimal area of the conductor of the process rule.

The scope of the present invention is not limited to the power supply line or the ground line, and the present invention can cover any conductor coupled to the fixed voltage. If the conductor is coupled to the power supply voltage, it is the power supply line, and if it is coupled to the ground voltage, it is the ground line. In addition, the conductor can also be coupled to other fixed voltage, for example, reference voltage.

In the embodiment of FIG. 3, the metal layer 310 is a non-programmable metal layer, and the metal layer 320 can be a programmable metal layer or a non-programmable metal layer. The metal layer 320 can be located above or under the metal layer 310. Other metal layers may exist or may not exist between the metal layers 310 and 320.

Figure 4A:
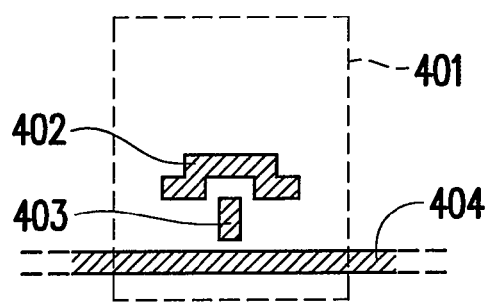
FIG. 4A is a schematic view of the routing of a conventional cell.
Figure 4B:
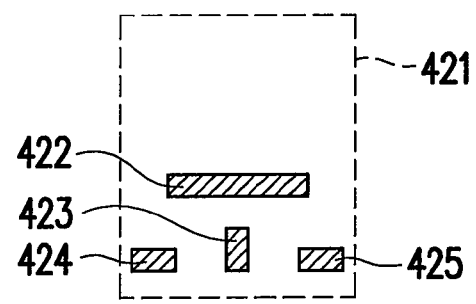
FIG. 4B is a schematic view of the routing of a cell according to an embodiment of the present invention.

By adopting the segment design, the area occupied by the power supply line and the ground line can be reduced, so as to simplify the routing of the cell. FIGS. 4A and 4B show the example. In the conventional cell 401 of FIG. 4A, due to the passing-through ground line 404, a wire 402 must turn twice to go round a wire 403. On the other hand, if the segment ground line of this embodiment is adopted, the conventional cell 401 can be modified to be the cell 421 of this embodiment, in which the ground line 404 becomes two segments 424 and 425. The free area can make the wire 403 move downwards, so as to become a wire 423. Therefore, the wire 402 can become a wire 422 after being drawn straight. In a word, the routing of the cell 421 is simpler than the cell 401 with more available space.

Figure 5:
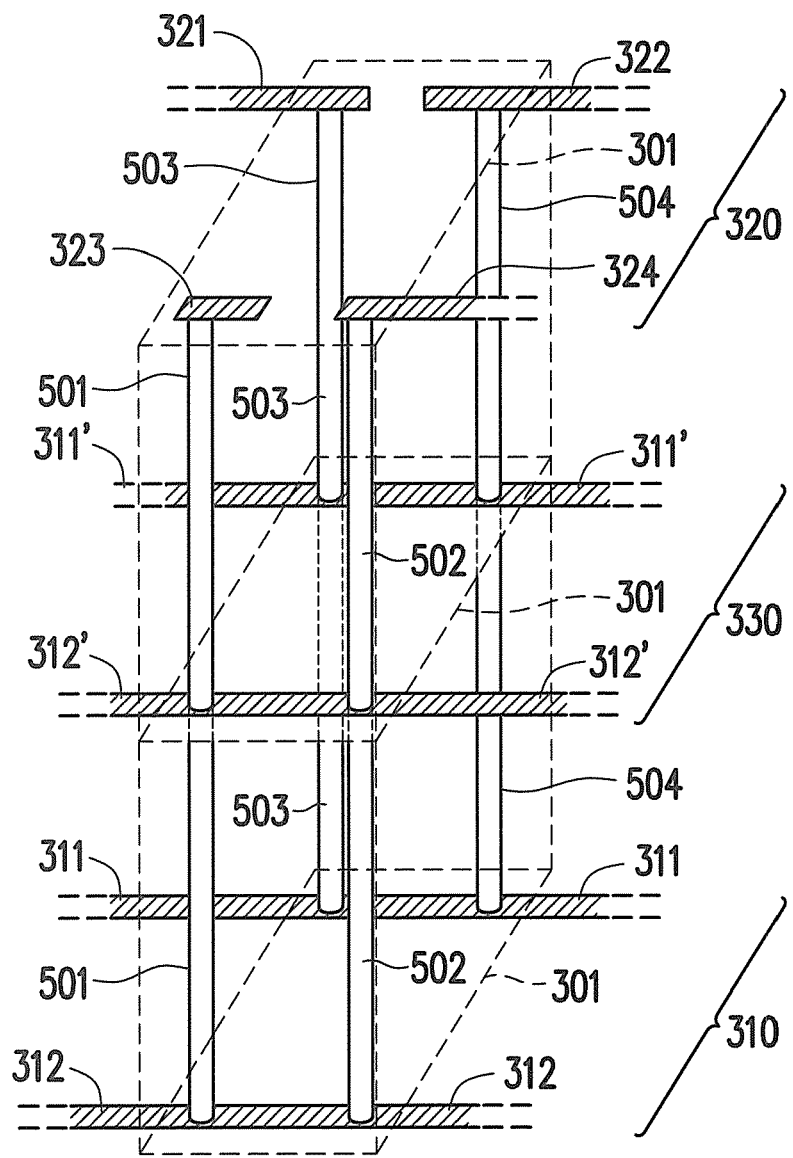

FIG. 5 is a schematic view of the power supply line and the ground line of the power supply architecture according to other embodiment of the present invention. The power supply architecture is applied to the structural ASIC. A cell of this embodiment is marked by 301. The structural ASIC comprises a first metal layer 310, a second metal layer 320 and a third metal layer 330, wherein the third metal layer 330 is located between the first metal layer 310 and the second metal layer 320. The metal layer 310 includes a power supply line 311 and a ground line 312. The metal layer 320 includes power supply lines 321 and 322, and ground lines 323 and 324. The metal layers 310 and 320 can refer to FIG. 3.

The metal layer 330 includes a power supply line 311' and a ground line 312', referring FIG. 5. The power supply lines 311, 311' and 321 are connected to each other through a contact 503, and the power supply lines 311, 311' and 322 are connected to each other through a contact 504. The ground lines 312, 312' and 323 are connected to each other through a contact 501, and the ground lines 312, 312' and 324 are connected to each other through the contact 502.

To sum up, for the fixed voltage wire of the present invention, the passing-through design is only adopted at one metal layer, and the segment design is adopted in other metal layers, thereby reducing the area occupied by the fixed voltage. The free area can be used to simplify the routing, to increase the routing flexibility, to bring more routing space for the user, even to reduce the mask layer, thereby reducing the cost on research, development, and fabrication of the integrated circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power supply architecture, applied to a structural application-specific integrated circuit (ASIC), comprising:
    a first conductor being a first power supply line or a first ground line, coupled to a fixed voltage, and at least passing through two edges of a cell; and
    a second conductor being a second power supply line or a second ground line, wherein the second power supply line or the second ground line is connected with the first power supply line or the first ground line, respectively, through a contact, and at most passes through an edge of the cell;
    wherein the structural ASIC comprises a first metal layer and a second metal layer, the first metal layer comprises the first conductor, and the second metal layer comprises the second conductor.

2. The power supply architecture according to claim 1, wherein the structural ASIC further comprises a third metal layer located between the first metal layer and the second metal layer.

3. The power supply architecture according to claim 1, wherein the fixed voltage is a reference voltage.

4. The power supply architecture according to claim 1, wherein no other metal layer exists between the first metal layer and the second metal layer.

5. The power supply architecture according to claim 1, wherein the second conductor only passes through an edge of the cell, and does not pass through other edges of the cell.

6. The power supply architecture according to claim 1, wherein the second conductor is in the cell, and does not pass through any edge of the cell.

7. The power supply architecture according to claim 1, wherein the second conductor satisfies a conductor minimal area of a process rule of the structural ASIC.

8. The power supply architecture according to claim 1, wherein the first metal layer is a non-programmable metal layer.

9. The power supply architecture according to claim 1, wherein the second metal layer is a programmable metal layer.

10. The power supply architecture according to claim 1, wherein the second metal layer is a non-programmable metal layer.

11. The power supply architecture according to claim 1, wherein the first metal layer is located above the second metal layer.

12. The power supply architecture according to claim 1, wherein the second metal layer is located above the first metal layer.

* * * * *